United States Patent
Bohr et al.

(10) Patent No.: US 11,037,923 B2
(45) Date of Patent: Jun. 15, 2021

(54) THROUGH GATE FIN ISOLATION

(75) Inventors: Mark T. Bohr, Aloha, OR (US);
Stephen M. Cea, Hillsboro, OR (US);
Barbara A. Chappell, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/538,935

(22) Filed: Jun. 29, 2012

(65) Prior Publication Data
US 2014/0001572 A1 Jan. 2, 2014

(51) Int. Cl.
| | |
|---|---|
| H01L 27/088 | (2006.01) |
| H01L 21/8234 | (2006.01) |
| H01L 21/8238 | (2006.01) |
| H01L 27/092 | (2006.01) |
| H01L 27/12 | (2006.01) |
| H01L 21/84 | (2006.01) |

(52) U.S. Cl.
CPC .. *H01L 27/0886* (2013.01); *H01L 21/823431* (2013.01); *H01L 21/823821* (2013.01); *H01L 21/845* (2013.01); *H01L 27/0924* (2013.01); *H01L 27/1211* (2013.01)

(58) Field of Classification Search
CPC ......... H01L 21/823821; H01L 27/0886; H01L 21/823431; H01L 21/845; H01L 27/0924; H01L 27/1211
USPC ...................................................... 257/401
See application file for complete search history.

(56) References Cited

U.S. PATENT DOCUMENTS

| | | | |
|---|---|---|---|
| 7,737,501 B2* | 6/2010 | Zhu et al. ..................... 257/365 |
| 7,927,938 B2* | 4/2011 | El-Kareh ............ H01L 21/8232 |
| | | | 257/E21.421 |
| 2004/0253775 A1* | 12/2004 | Achuthan ................ C09G 1/02 |
| | | | 438/197 |

(Continued)

FOREIGN PATENT DOCUMENTS

| | | |
|---|---|---|
| CN | 102314931 | 1/2012 |
| KR | 10-2005-0053986 A1 | 6/2005 |

(Continued)

OTHER PUBLICATIONS

International Search Report and Written Opinion dated Nov. 19, 2013 for PCT/US2013/043892 filed Jun. 3, 2013.

(Continued)

*Primary Examiner* — Steven B Gauthier
*Assistant Examiner* — Christopher A Culbert
(74) *Attorney, Agent, or Firm* — Schwabe, Williamson & Wyatt, P.C.

(57) ABSTRACT

Through gate fin isolation for non-planar transistors in a microelectronic device, such as an integrated circuit (IC). In embodiments, ends of adjacent semiconductor fins are electrically isolated from each other with an isolation region that is self-aligned to gate electrodes of the semiconductor fins enabling higher transistor packing density and other benefits. In an embodiment, a single mask is employed to form a plurality of sacrificial placeholder stripes of a fixed pitch, a first subset of placeholder stripes is removed and isolation cuts made into the semiconductor fins in openings resulting from the first subset removal while a second subset of the placeholder stripes is replaced with gate electrodes.

9 Claims, 10 Drawing Sheets

(56) References Cited

U.S. PATENT DOCUMENTS

| | | | |
|---|---|---|---|
| 2009/0001463 A1* | 1/2009 | Lenoble | H01L 29/66795 257/344 |
| 2009/0200604 A1 | 8/2009 | Chidambarrao et al. | |
| 2009/0206375 A1* | 8/2009 | Saha et al. | 257/281 |
| 2011/0084313 A1* | 4/2011 | Witters et al. | 257/204 |
| 2011/0303915 A1* | 12/2011 | Cheng | H01L 21/823412 257/48 |
| 2012/0001232 A1* | 1/2012 | Liaw | 257/208 |
| 2014/0367865 A1* | 12/2014 | Powell | H01L 24/05 257/777 |

FOREIGN PATENT DOCUMENTS

| | | |
|---|---|---|
| KR | 10-2005-0094576 A | 9/2005 |
| KR | 10-2011-0027719 A | 3/2011 |
| TW | 200715467 | 4/2007 |
| TW | 2008-18338 | 4/2008 |
| TW | 201017733 | 5/2010 |
| TW | 20131263 | 1/2013 |

OTHER PUBLICATIONS

Taiwan Office Action and Search Report, for corresponding Taiwan Application No. 102120532, dated Jan. 6, 2015, 29 pages, and English translation thereof.
International Preliminary Report on Patentability, for corresponding International Application No. PCT/US2013/043892, dated Dec. 31, 2014, 9 pages.
Taiwan Office Action for corresponding Taiwan Application No. 102120532, dated May 22, 2015, and English translation 26 pages.
Office Action for Taiwan Patent Application No. 102120532 dated Jun. 5, 2018, 19 pages.
Office Action from Taiwan Patent Application No. 107145501, dated Nov. 5, 2020, 9 pgs.
Office Action for Taiwan Patent Application No. 107145299, dated Oct. 31, 2020, 9 pgs.
Office Action from Taiwan Patent Application No. 107131370, dated Nov. 28, 2019, 13 pgs.
Office Action from Taiwan Patent Application No. 107145501, dated Mar. 31, 2020, 7 pgs.
Office Action for Taiwan Patent Application No. 107145299, dated Mar. 30, 2020, 7 pgs.

* cited by examiner

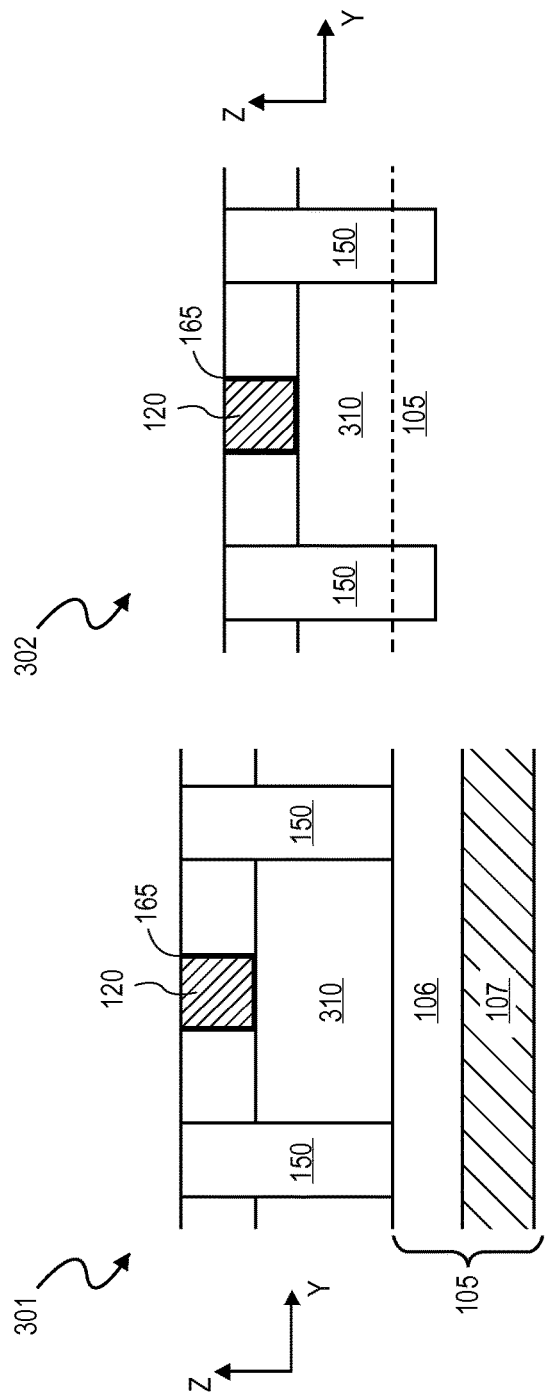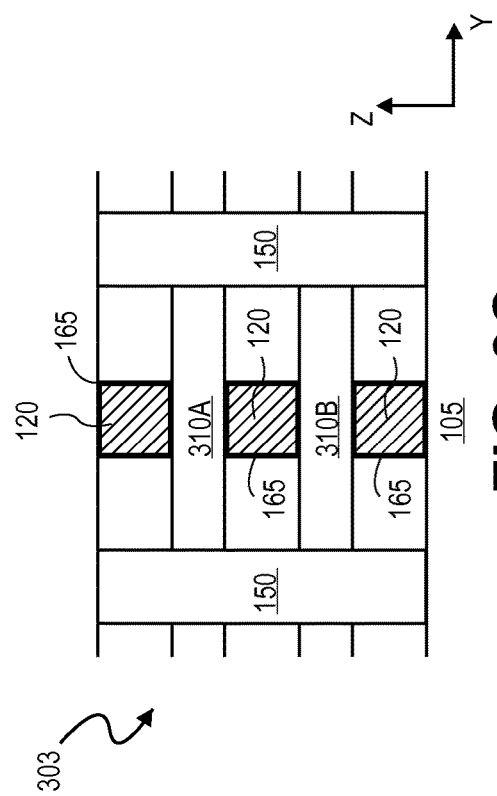
FIG. 3A
FIG. 3B
FIG. 3C

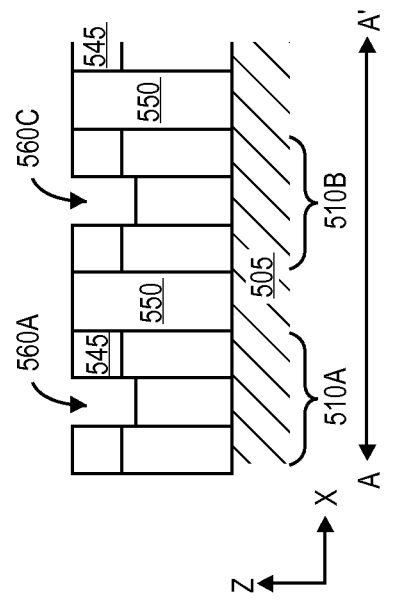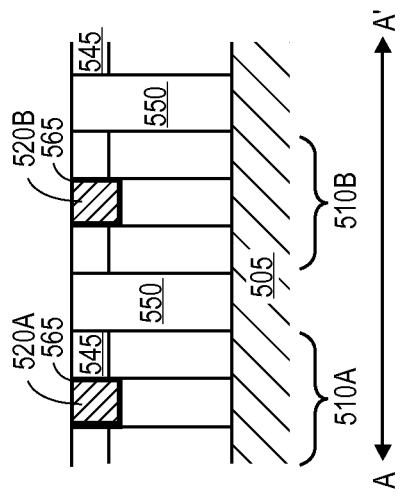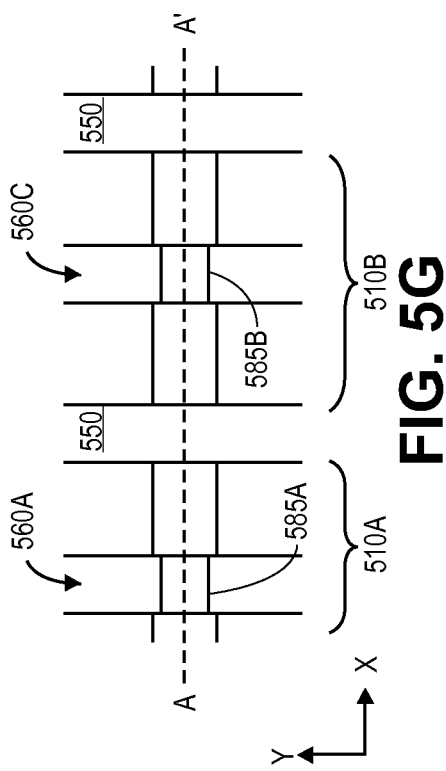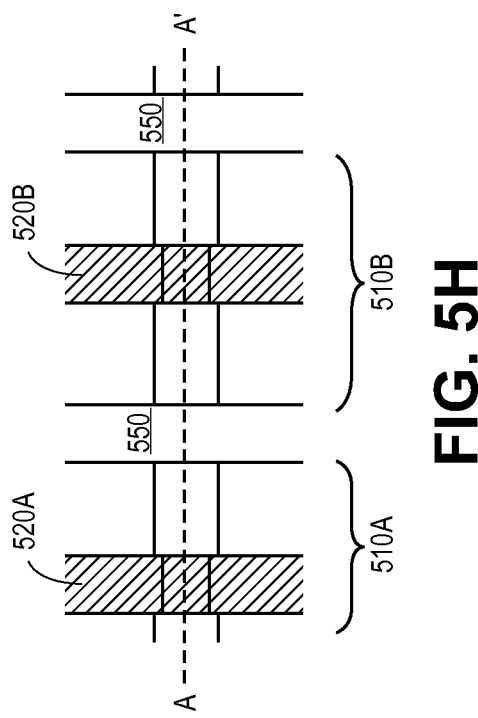

THROUGH GATE FIN ISOLATION

TECHNICAL FIELD

Embodiments of the invention generally relate to transistor architectures and fabrication, and more particularly relate to electrical isolation of adjacent non-planar (fin) transistors formed on a substrate.

BACKGROUND

The microelectronics industry is now in transition from a planar to a non-planar field effect transistor (i.e., Tri-gate or FinFET) continuing with device scaling as charted by Moore's Law. Pioneers of non-planar transistor technology are now developing second generation non-planar devices and achieving ever higher levels of transistor performance and density. In addition to scaling of individual transistors, the number of transistors of a given channel length that can be fabricated within a given substrate area (i.e., transistor density) is also very important to achieve higher transistor counts for greater levels of integrated circuit (IC) functionality.

Non-planar transistors which utilize a fin of semiconductor material protruding from a substrate surface employ a gate electrode that wraps around two, three, or even all sides of the fin (i.e., dual-gate, tri-gate, nanowire transistors). Source and drain regions are then formed in the fin, or as re-grown portions of the fin, on either side of the gate electrode. To isolate a source/drain region of a first non-planar transistor from a source/drain region of an adjacent second non-planar transistor, a gap or space may be formed between two adjacent fins. Such an isolation gap generally requires a masked etch of some sort. Once isolated, a gate stack is then patterned over the individual fins, again typically with a masked etch of some sort (e.g., a line etch or an opening etch depending on the specific implementation).

BRIEF DESCRIPTION OF THE DRAWINGS

Embodiments of the present invention are illustrated by way of example, and not by way of limitation, and can be more fully understood with reference to the following detailed description when considered in connection with the figures in which:

FIGS. 3A, 3B and 3C are cross-sectional views of through gate isolation applied to various substrate and transistor architectures, in accordance with embodiments;

FIGS. 5A, 5B, 5C, 5D, 5E, 5F, 5G and 5H are plan views illustrating an evolution of non-planar transistor and through gate fin isolation structures as a through gate fin isolation fabrication process is performed, in accordance with an embodiment;

FIGS. 6A, 6B, 6C, 6D, 6E, 6F, 6G and 6H are cross-sectional views corresponding to FIGS. 5A, 5B, 5C, 5D, 5E, 5F, 5G and 5H further illustrating an evolution of non-planar transistor and through gate fin isolation structures as a through gate fin isolation fabrication process is performed, in accordance with an embodiment;

DETAILED DESCRIPTION

Figure 1A:
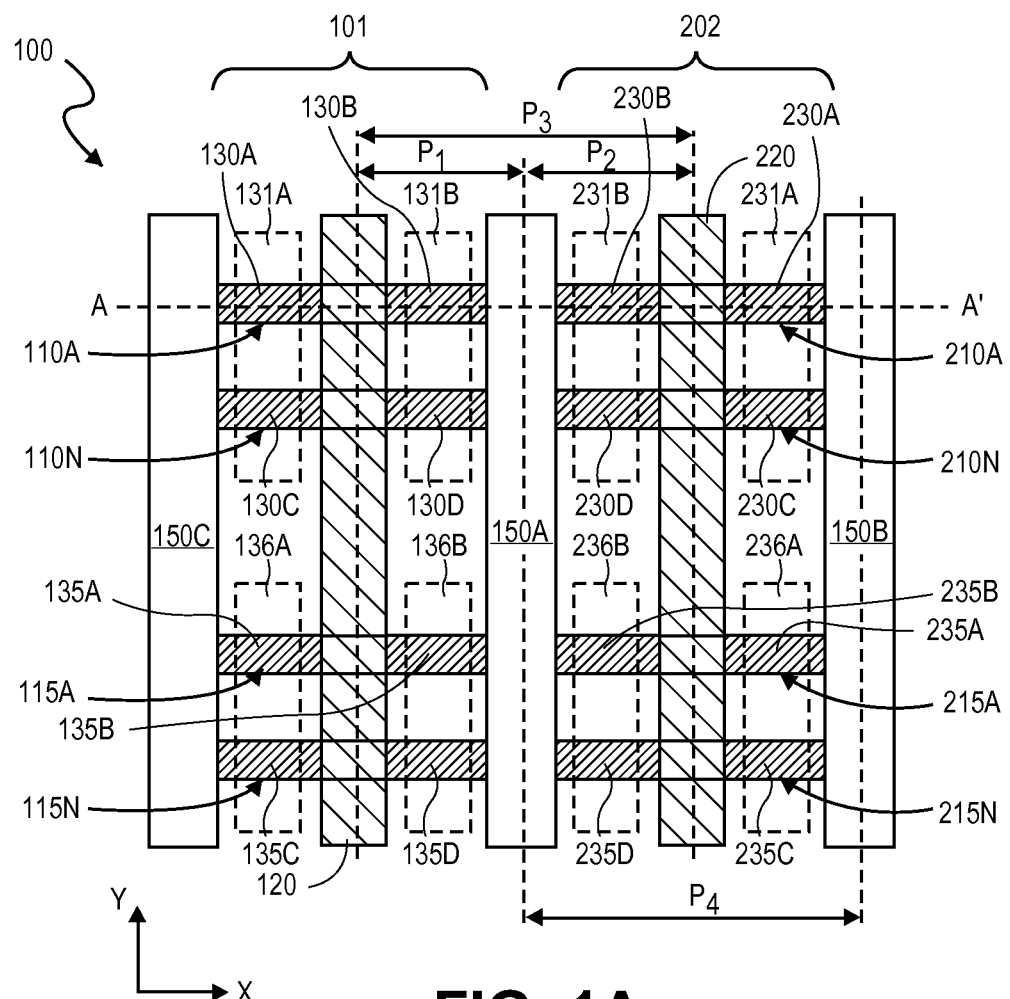
FIG. 1A is a plan view of two adjacent inverters (or NOT gates) employing non-planar transistors and through gate fin isolation in accordance with an embodiment of the present invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

One problem with the fin isolation techniques described in the background is that the gates are not self-aligned with the ends of the fins, and alignment of the gate stack pattern with the semiconductor fin pattern relies on overlay of these two patterns. As such, lithographic overlay tolerances are added into the dimensioning of the semiconductor fin and the isolation gap with fins needing to be of greater length and isolation gaps larger than they would be otherwise for a given level of transistor functionality. Device architectures and fabrication techniques that reduce such over-dimensioning therefore offer highly advantageous improvements in transistor density.

Another problem with the fin isolation techniques described in the background is that stress in the semiconductor fin desirable for improving carrier mobility may be lost from the channel region of the transistor where too many fin surfaces are left free during fabrication, allowing fin strain to relax. Device architectures and fabrication techniques that maintain higher levels of desirable fin stress therefore offer advantageous improvements in non-planar transistor performance.

Through gate fin isolation architectures and techniques are described herein. In the exemplary embodiments illustrated, non-planar transistors in a microelectronic device, such as an integrated circuit (IC) are isolated from one another in a manner that is self-aligned to gate electrodes of the transistors. Although embodiments of the present invention are applicable to virtually any IC employing non-planar transistors, exemplary ICs include, but are not limited to, microprocessor cores including logic and memory (SRAM) portions, RFICs (e.g., wireless ICs including digital baseband and analog front end modules), and power ICs.

In embodiments, two ends of adjacent semiconductor fins are electrically isolated from each other with an isolation region that is positioned relative to gate electrodes with the use of only one patterning mask level. In an embodiment, a single mask is employed to form a plurality of sacrificial placeholder stripes of a fixed pitch, a first subset of the placeholder stripes define a location and/or dimension of isolation regions while a second subset of the placeholder stripes defines a location and/or dimension of a gate electrode. In certain embodiments, the first subset of placeholder stripes is removed and isolation cuts made into the semiconductor fins in the openings resulting from the first subset removal while the second subset of the placeholder stripes is ultimately replaced with non-sacrificial gate electrode stacks. Because a subset of placeholders utilized for gate electrode replacement are employed to form the isolation regions, the method and resulting architecture is referred to herein as "through gate" isolation. One or more through-gate isolation embodiment described herein may, for example, enable higher transistor densities and higher levels of advantageous transistor channel stress.

With isolation defined after placement/definition of the gate electrode, a greater transistor density can be achieved because fin isolation dimensioning and placement can be made perfectly on-pitch with the gate electrodes so that both gate electrodes and isolation regions are integer multiples of a minimum feature pitch of a single masking level. In further embodiments where the semiconductor fin has a lattice mismatch with a substrate on which the fin is disposed, greater degrees of strain are maintained by defining the isolation after placement/definition of the gate electrode. For such embodiments, other features of the transistor (such as the gate electrode and added source and/or drain materials) that are formed before ends of the fin are defined help to mechanically maintain fin strain after an isolation cut is made into the fin.

Figure 1B:
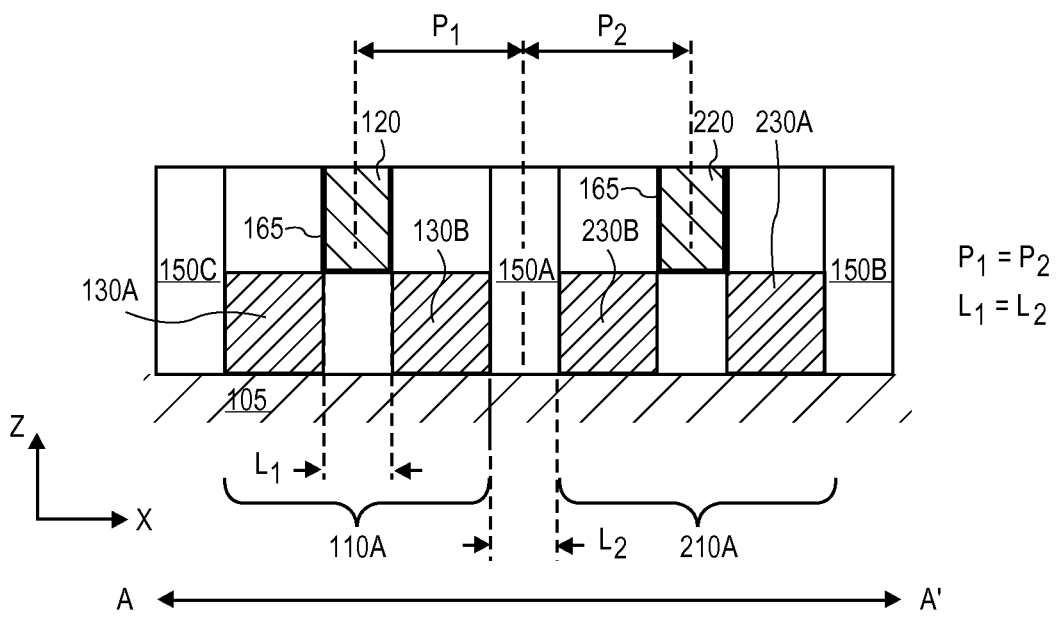
FIG. 1B is a cross-sectional view of two adjacent non-planar transistors from FIG. 1A, further illustrating the through gate fin isolation, in accordance with an embodiment.

FIG. 1A is a plan view of a microelectronic device 100 including two adjacent CMOS inverters (or NOT gates) 101 and 202 employing non-planar transistors and through gate fin isolation in accordance with an embodiment of the present invention. FIG. 1B is a cross-sectional view along the A-A' line passing through two adjacent semiconductor fins from FIG. 1A, further illustrating through gate fin isolation, in accordance with an embodiment. While the exemplary embodiment is illustrated in the context of particular logic gates for clarity of description, it is to be appreciated that any integrated circuit elements may be implemented with through gate fin isolation in a similar manner to benefit from the same technical advantages illustrated in the context of the microelectronic device 100.

As shown in FIGS. 1A and 1B, a gate electrode 120 is disposed over a semiconductor fin 110A. The semiconductor fin 110A protrudes from a surface of the substrate 105 so that the gate electrode 120 wraps around two (e.g., opposing fin sidewalls out of the plane of FIG. 1B) or three sides (e.g., top surface of the fin as shown in FIG. 1B and opposing fin sidewalls for a tri-gate embodiment). Beyond the fin 110A having sidewalls which are electrically (capacitively) coupled to the gate electrode 120, the fin 110A may have any number of shapes. Generally, the substrate 105 may be any known in the art suitable for the purpose of fabricating non-planar transistors, including, but not limited to, bulk substrates which may be any conventional material, such as, but not limited to single crystalline silicon, germanium, III-V compound semiconductor (e.g., GaAs, InP, etc.), III-Nitride compound semiconductor (e.g., GaN), or sapphire. In alternate embodiments, as further illustrated elsewhere herein, semiconductor on insulator (SOI) substrates are utilized.

The semiconductor fin 110A may also be of any semiconducting material composition known in the art to be suitable for the purpose of fabricating non-planar transistors, including, but not limited to, single crystalline silicon (e.g., either having continuity with the substrate 105 for bulk embodiments or separated from the substrate 105 by an intervening material for SOI embodiments). As further described elsewhere herein, in certain advantageous embodiments the semiconductor fin 110A is of a semiconductor material that has a different lattice constant than that of the substrate 105 (i.e., lattice mismatched). Examples include, but are not limited to SiGe alloys. For such embodiments, the semiconductor fin 110A may be either lattice strained for high carrier mobility (e.g., as for a 25-35% Ge SiGe alloy) or lattice relaxed (e.g., as for a III-V or III-N semiconductor fin) with some of the benefits of through gate isolation embodiments implemented with lattice strained semiconductor fins discussed more specifically elsewhere herein.

The gate electrode 120, as illustrated in FIG. 3A, is a portion of a gate electrode stack which further includes a gate dielectric layer 165 illustrated in FIG. 1B. Generally, the gate electrode 120 and gate dielectric layer 165 may be of any material compositions known in the art to be applicable to non-planar transistors with many known ultra high-k materials (e.g., having a dielectric constant above that of $Si_3N_4$), as well as silicon nitride and silicon dioxide, being viable options for the embodiments described herein.

The semiconductor fin 110A further includes a first source/drain region 130A and a second source/drain region 130B disposed on either side of the gate electrode 120. The source/drain regions 120A, 130A may be doped regions of the semiconductor fin 110A and may include regrown or epitaxially deposited semiconductor regions. Generally, each of the CMOS inverter 101 and CMOS inverter 202 includes a transistor of a first conductivity type (e.g., N-type) and a transistor of a second, complementary, conductivity type (e.g., P-type). As such, the microelectronic device 100 includes a pair of transistors of each complementary type. While these complementary transistor pairings may be implemented in a number of manners within the confines of the present invention, in the exemplary embodiment, a first transistor employing the semiconductor fin 110A has source/drain regions 130A, 130B of a first conductivity type (e.g., N-type); a second transistor employing a semiconductor fin 210A has source/drain regions 230A, 230B of the first conductivity type (e.g., N-type); a third transistor employing a semiconductor fin 115A has source/drain regions 135A, 135B of a second conductivity type (e.g., P-type); and a fourth transistor employing a semiconductor fin 215A has source/drain regions 235A, 235B of the second conductivity type (e.g., P-type). Each of these source/drain regions are further coupled to source/drain contacts 131A, 131B, 136A, 136B, 231A, 231B, 236A, and 236B, drawn in dashed line for the sake of clearly illustrating the underlying fin structure.

Notably, a microelectronic device may include any number of non-planar transistors electrically coupled together in parallel for a greater current carrying channel width and embodiments of the present invention are not limited in this respect. For the exemplary microelectronic device 100, each of the semiconductor fins 110A, 115A, 210A, and 215A are replicated as fins 110N, 115N, 210N, and 215N, respectively, having source/drain regions 130C, 130D, 135C, 135D, 230C, 230D, 235C and 235D that also couple to the source/drain contacts 131A, 131B, 135A, 135B, 231A, 231B, 236A, and 236B, respectively.

As illustrated in FIG. 1A, in embodiments, the longitudinal length of the gate electrode 120 is significantly greater (e.g., more than twice) than a transverse width of the gate electrode 120 and is therefore referred to herein as a gate electrode "stripe." In FIG. 1A, first gate electrode 120 has a longitudinal length sufficient to extend over both the semiconductor fins 110A and 115A, coupling to channels of the complementary transistors within the inverter 101. The gate electrode 220 is similarly dimensioned as a gate electrode stripe. While the description herein should make the advantages of such architecture apparent to one of ordinary skill, it is noted that this particular feature is not required by embodiments of the present invention.

In an embodiment, a first isolation region is disposed between first and second gate electrodes and separates adjacent ends of first and second semiconductor fins. As shown in FIG. 1A, an isolation region 150A is disposed between the gate electrodes 120, 220 and more specifically abuts ends of both the first semiconductor fin 110A and the second semiconductor fin 210A. In the exemplary embodiment, the isolation region 150A is dimensioned, like the gate electrodes 120, 220, with a longitudinal length that is substantially longer than the transverse width, and is therefore referred to herein as an isolation "stripe." In FIG. 1A, the isolation region 150A has a longitudinal length sufficient to also extend between the semiconductor fins 115A, 215A. While the description herein should make the advantages of such architecture apparent to one of ordinary skill, it is noted that this particular feature is not required by embodiments of the present invention. Because the invertors 101 and 102 employ paralleled pluralities of fins for greater current carrying channel width, the isolation region 150A separates one paralleled plurality of fins (e.g., fins 110A and 110N) in the inverter 101 from a second paralleled plurality of fins (e.g., fins 210A and 210N) in the inverter 202.

In embodiments of the present invention, the isolation region disposed between adjacent semiconductor fins is self-aligned to a gate electrode. As shown in FIG. 1A, the edges of the first isolation region 150A are aligned with the end faces of both the semiconductor fins 110A and 210A. In other words the isolation region 150A abuts both the adjacent ends of the semiconductor fins 110A and 210A. As further illustrated in FIGS. 1A and 1B, a longitudinal centerline the first isolation region 150A (denoted by a dashed line) is disposed equidistant from, and parallel to, longitudinal centerlines of the gate electrodes 120, 220. With $P_1$ representing a first pitch between centerlines of the first gate electrode 120 and the isolation region 150A, and $P_2$ representing a second pitch between centerlines of the isolation region 150A and the second gate electrode 220, $P_1$ is substantially equal to $P_2$ so that the isolation region 150A is "on-pitch" with the gate electrode pitch $P_3$ defined by centerlines of the gate electrodes 120, 220. As one of ordinary skill will appreciate, this substantially equal pitch between gate electrodes and the intervening isolation is a hallmark of the isolation region 150A and gate electrodes 120, 220 being self-aligned. The term "self-aligned" is used herein in reference to the structural alignment between two features which lack overlay or misregistration tolerances inherent between features formed with separate masking levels. In contrast to non-self aligned features where a second feature patterned a second masking level must be actively aligned to an alignment feature from a first masking level, self-aligned features require no active alignment and have no corresponding alignment error. As such, it is noted that $P_1$ would not be substantially equal $P_2$ if the isolation region 150A and gate electrodes 120, 220 were not self-aligned because there would then be some level of misregistration of the first isolation region 150A to the gate electrodes 120, 220A. The term "substantially" in the context of the phrase "equal pitch" acknowledges that all manufacturing processes have tolerances and therefore the resulting structures are never truly perfect. For example, even in an embodiment where a single mask is employed to form isolation regions self-aligned with gate electrodes, the single mask can still be expected to have some tolerance across three mask features spaced apart at a same, equal design rule. As such, tolerances much smaller than those of overlay between two masks are achieved by certain embodiments described herein, such that $P_1$ and $P_2$ are "substantially equal," with $P_1$ being within 10% of $P_2$ in first embodiments, $P_1$ being within 5% of $P_2$ in second embodiments, $P_1$ being within 3% of $P_2$ in third embodiments, and $P_1$ being within 1% of $P_2$ in fourth embodiments In embodiments, the isolation region has a dimension that is substantially equal to a width of a gate stack. Here again, the term "substantially" is employed because there are tolerances inherent to a given fabrication process with the substantial equality being within 10% in first embodiments, within 5% in second embodiments, within 3% in third embodiments, and within 1% in fourth embodiments. As shown in FIG. 1B, the gate stack includes both the gate electrode 120 and a gate dielectric layer 165 in contact with the gate electrode 120. Depending on the implementation, the width of a gate stack may differ from the width of a gate electrode where gate dielectric is present on more than a bottom surface of the gate electrode. In the embodiment of FIG. 1B, the gate electrode 120 is disposed within a well having the gate dielectric layer 165 present on the well sidewalls such that the transverse width of the gate stack $L_1$ is approximately twice the thickness of the gate dielectric layer 165 added to the transverse width of the gate electrode 120 (and associated with a transistor channel length). Of course, in other embodiments where the gate dielectric is only present at the interface of a gate electrode and a semiconductor fin, the width of the gate stack is substantially equal to the width of the gate electrode. As further shown in FIG. 1B, the transverse width of the isolation region 150A is $L_2$ with $L_2$ being approximately equal to $L_1$ (e.g., within 10%), and preferably no larger than $L_1$. Along with the self-alignment of the isolation region 150A, minimal transverse dimensioning of the isolation region 150A advantageously reduces the x-dimension of the substrate 105 occupied by the inverters 101 and 202 (i.e., reduces area of an inverter unit cell).

In embodiments, a second isolation region is disposed on an end of a semiconductor fin opposite the first isolation region. As shown in FIGS. 1A and 1B, for example, an isolation region 150B is disposed on an end of the semiconductor fin 210A opposite the first isolation region 150A. Centerlines of the isolation region 150A and the isolation region 150B define an isolation pitch $P_4$. In embodiments, the isolation pitch is an integer multiple of a minimum pitch for the gate electrodes ($P_{Gate,min}$).

Figure 2:
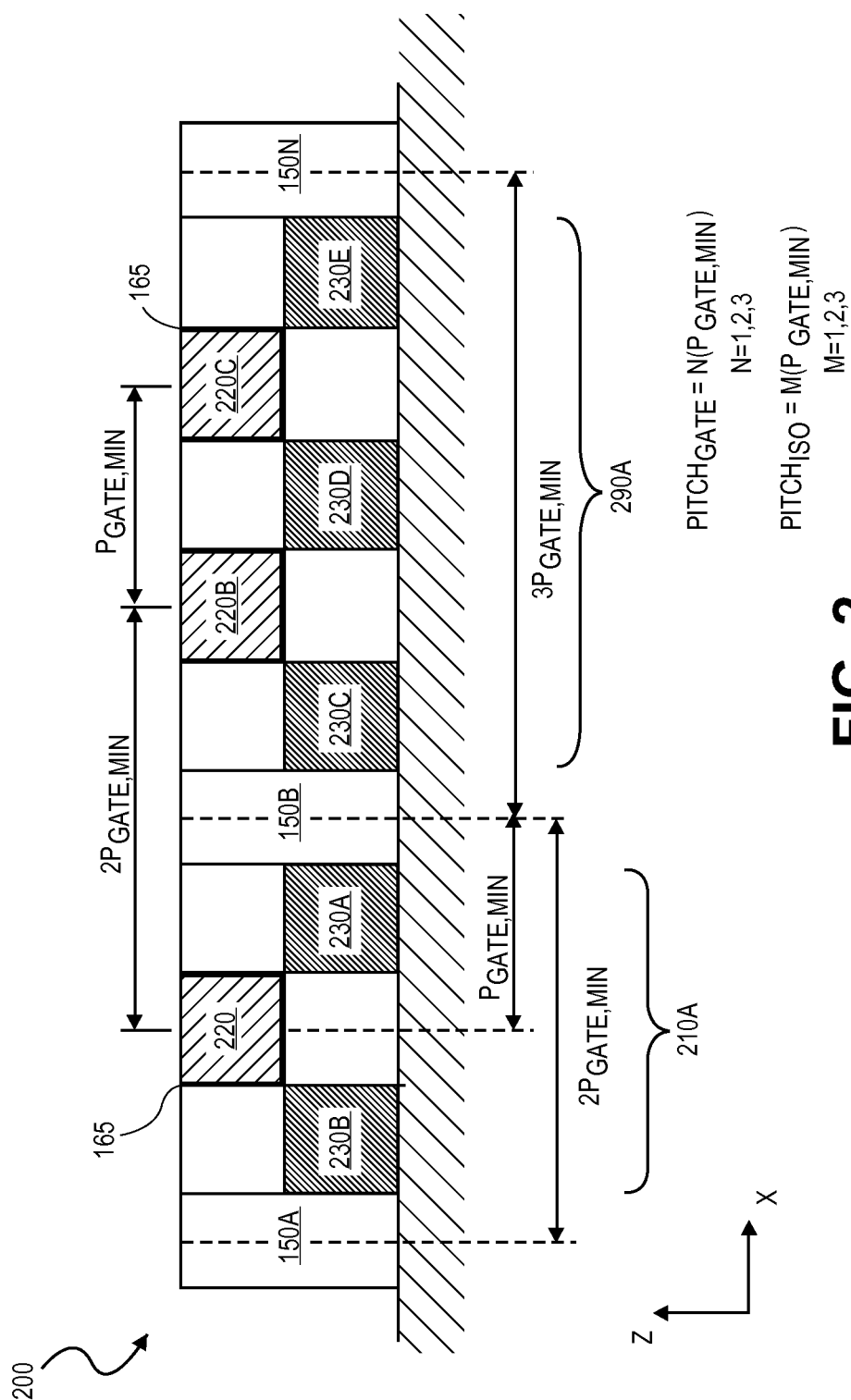
FIG. 2 is a cross-sectional view of three adjacent non-planar transistors with through gate fin isolation in accordance with an embodiment of the present invention.

FIG. 2 is a cross-sectional view of a microelectronic device 200 including three adjacent non-planar transistors with through gate fin isolation in accordance with an embodiment of the present invention. FIG. 2, illustrates semiconductor fins 210A and 290A in a cross-sectional view akin to that of FIG. 1B. For example, FIG. 2 may be considered an extended view of FIG. 1 that further illustrates devices adjacent to the inverter 202. The gate electrode 220 is disposed over the semiconductor fin 210A while two gate electrodes 220B and 220C are disposed over the semiconductor fin 290A. The isolation region 150B separates the fin 210A from the fin 290A. Because there is no isolation region between the gate electrodes 220B and 220C, centerlines of the gate electrodes 220B and 220C define the minimum gate electrode pitch, $P_{Gate,Min}$. With the isolation region 150B being on-pitch with the gate electrode pitch, centerlines of gate electrodes 220 and 220B, separated by the intervening isolation region 150B, are at an integer multiple of the minimum gate electrode pitch (e.g., twice $P_{Gate,Min}$). Even for embodiments where two gate electrodes are separated by multiple intervening isolation regions, centerlines of the gate electrodes remain at an integer multiple of the minimum gate electrode pitch.

Similarly, adjacent isolation regions separated by one or more intervening gate electrode are at an integer multiple of the minimum gate electrode pitch. For example, isolation regions 150A and 150B surrounding fin 210A are at twice $P_{Gate,Min}$ and isolation regions 150B and 150N surrounding fin 290A are at three times $P_{Gate,Min}$. As such, all isolation regions 150A, 150B, 150N and gate electrodes 220, 220B, 220C are at the same (substantially equal, fixed) pitch with adjacent isolation regions and electrodes at a minimum pitch. FIGS. 1A and 1B illustrate the same characteristic with the isolation stripe pitch $P_4$ being substantially equal to the gate electrode stripe pitch $P_3$. The isolation regions 150A, B, C are interdigitated with the gate electrodes 120, 220 with both being at integer multiples of a fixed minimum stripe pitch (e.g., $P_1$). Thus, as shown in FIGS. 1A, 1B and FIG. 2, a plurality of isolation stripes are self-aligned to a plurality of gate electrode stripes disposed over a plurality of semiconductor fins with the plurality of isolation regions having no misregistration with the plurality of gate electrodes.

FIGS. 3A, 3B and 3C are cross-sectional views of through gate isolation with various alternative substrate and transistor architectures, in accordance with embodiments. The FIGS. 3A-3C are illustrations along a cross-section plane analogous to that denoted by the A-A' line in FIG. 1A.

In FIG. 3A, the non-planar transistor 301 includes a semiconductor fin 310 disposed on an SOI substrate 105 that includes both an isolation dielectric layer 106 and a handling substrate 107. As shown, the through gate isolation regions 150 have the same structural relationship with the gate electrode 120 (and gate stack including the gate electrode 120 and gate dielectric layer 165) as was described in the context of FIGS. 1A, 1B and FIG. 2 with the additional clarification that the isolation regions 150 extend all the way through the semiconductor fin 310 and make direct contact with the isolation dielectric layer 107.

FIG. 3B further illustrates a bulk substrate embodiment where the non-planar transistor 302 includes a semiconductor fin 310 having crystallographic continuity with the semiconductor substrate 105 (the dashed line denoting where a top surface of the substrate 105 is out of the plane of the FIG. 3B). As shown, the isolation regions 150 extend down through the semiconductor fin 310 preferably at least to the top surface of substrate 105 and more preferably to a level into the substrate 105 that is below the top substrate surface for reduced leakage, latch-up, etc.

FIG. 3C further illustrates an embodiment with a nanowire transistor 303 where at least one semiconductor nanowire 310A is surrounded on all sides by the gate electrode 120 (and gate dielectric layer 165). The semiconductor nanowire 310A may be of any semiconductor composition described elsewhere herein in the general context of a semiconductor fin. Additional nanowires (e.g., 310B) may form a vertical (z-dimension) stack of nanowires, in which case the isolation regions 150 pass through the z-thicknesses of every nanowire, and may further extend down to the substrate 105. As illustrated by FIGS. 3A, 3B and 3C, embodiments of the present invention are not limited with respect to either the substrate 105 or the semiconductor fin geometry.

With through gate isolation architectures described, methods of fabricating such structures are now discussed. Generally, through gate isolation bifurcates a semiconductor fin at one or more isolation points that is self-aligned to the gate electrode. These self-aligned isolation points then become the isolation regions between adjacent fins. In embodiments, self-alignment of the isolation points between adjacent fins is achieved by defining a set of sacrificial precursor, or "placeholder" features having dimensions which ultimately dictate those of both the gate electrodes and the isolation regions. Once these placeholder features are defined, subsets of the placeholder features are then modified separately and independently to complete formation of isolation regions and the gate electrodes. As the sacrificial placeholder features are formed concurrently, for example with a single masking level, isolation regions and gate electrodes may be perfectly aligned at a given minimum feature pitch.

Figure 4:
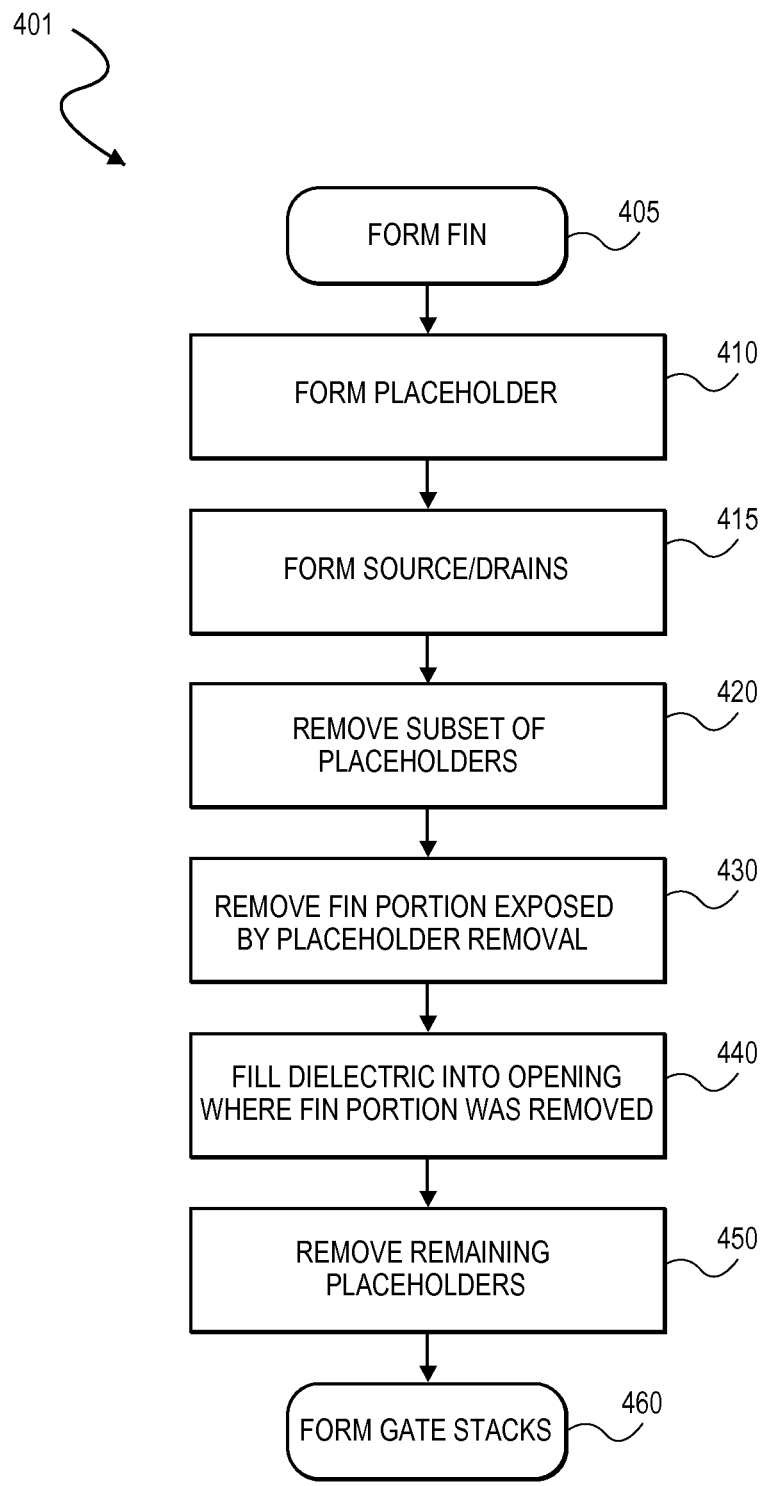
FIG. 4 is a flow diagram describing a through gate fin isolation fabrication process, in accordance with embodiments.

FIG. 4 is a flow diagram describing a through gate fin isolation fabrication method 401, in accordance with certain embodiments. FIGS. 5A, 5B, 5C, 5D, 5E, 5F, 5G, and 5H are plan views illustrating an evolution of non-planar transistor and through gate fin isolation structures as the through gate fin isolation fabrication method 401 is performed, in accordance with one exemplary embodiment. FIGS. 6A, 6B, 6C, 6D, 6E, 6F, 6G and 6H are cross-sectional views along the A-A' line denoted in the corresponding FIG. 5A-5H.

Figure 5A:
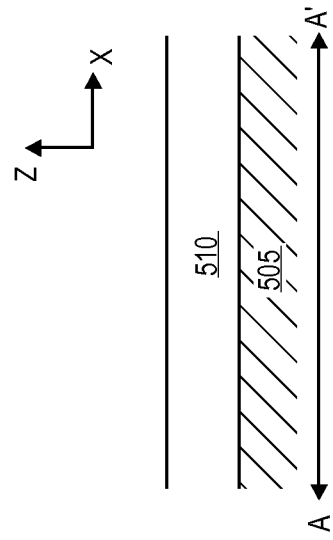
Figure 5B:
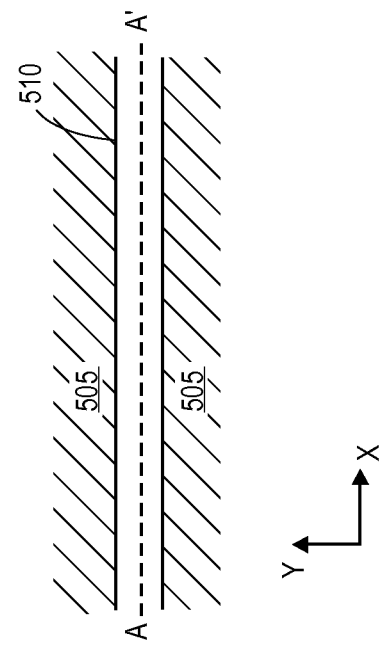
Figure 6A:
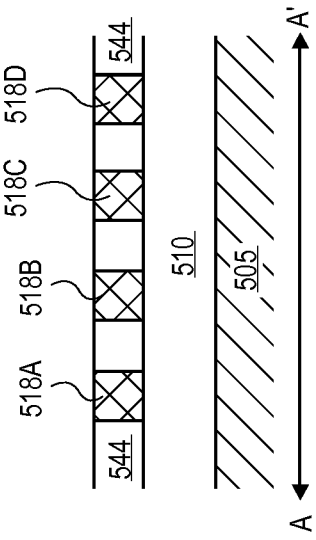
Figure 6B:
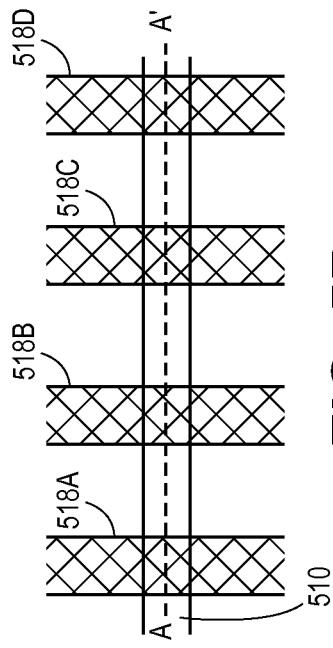

Referring first to FIG. 4, the through gate isolation method 401 begins with forming a semiconductor fin at operation 405. FIG. 5A shows a plan view of a semiconductor fin 510 formed on substrate 505. A cross-sectional view along the A-A' line extending longitudinally along the fin 510 is further illustrated in FIG. 6A. As shown in FIGS. 5A and 6A, following operation 405 the semiconductor fin 510 is of a first length, which is not limiting with respect to embodiments of the present invention beyond being sufficiently long to ultimately form at least one non-planar transistor, preferably at least two non-planar transistors, and ideally a very great many transistors. Any technique known in the art may be utilized to form the semiconductor fin 510 at operation 405, such as, but not limited to plasma etching and/or wet chemical etching.

Returning to FIG. 4, at operation 410 placeholders are formed. In the exemplary embodiment shown in FIGS. 5A and 5B placeholder stripes 518A, 518B, 518C and 518D are formed orthogonally over the semiconductor fin 510. As shown, the placeholder stripes 518A, 518B, 518C, and 518D are substantially parallel to each other and may be printed with a mask that advantageously leverages optical properties of such a periodic structure (i.e., grating) to achieve a minimum pitch between the placeholder stripes. In the exemplary embodiment, as further illustrated by FIG. 6B, the placeholder stripes 518A-518D are planarized regions formed in a surrounding material 544. A variety of materials may be utilized for the placeholder stripes 518A-518D, such as but not limited to, polysilicon, germanium, and SiGe, while the surrounding material 544 is of a composition at least offering a basis for subsequent etch selectivity, and preferably is a dielectric, such as, but not limited to, one or more of silicon dioxide, silicon nitride, or low-k dielectrics having a dielectric constant below that of silicon dioxide, such as, but not limited to carbon-doped oxide (CDO).

Figure 5C:
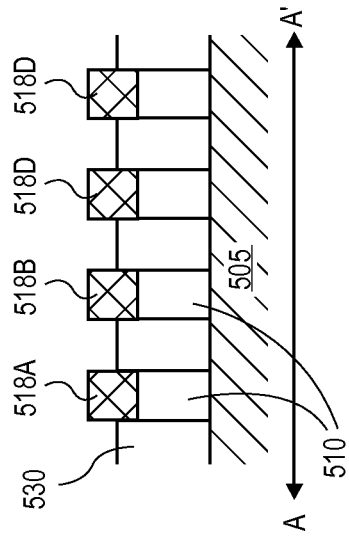
Figure 6C:
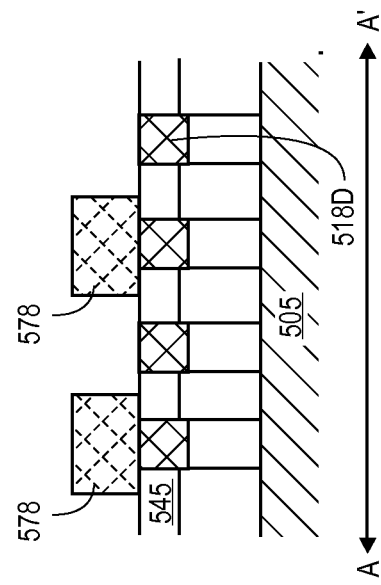

Returning to FIG. 4, at operation 415, source/drain regions are formed. Although, in general, source/drain region may be performed at various points in the method 401, in the exemplary embodiment, the source/drain regions are formed prior to removing any of the placeholders formed at operation 410. As illustrated in FIGS. 5C and 6C, source/drain regions 530 are formed between the placeholder stripes 518A-518D. In the exemplary embodiment, along the centerline of the fin 510, the source/drain regions 530 occupy the entire z-height of the fin down to the substrate 505. In other embodiments, source/drain regions may have a z-height different than that of a fin (e.g., greater or lesser z-height than that of a fin). Generally, any source/drain formation process applicable to a non-planar device may be employed at operation 415, beginning with removal of the surrounding material 544 (selectively to the placeholder strips 518A-518D).

In one embodiment, a dopant species (e.g., boron, arsenic, phosphorous, etc.) is implanted into the fin 510 to form the source/drain regions 530. In another embodiment, an epitaxial layer is deposited on the fin 510 to form the source/drain regions 530. Any epitaxial material composition known in the art may be utilized, such as, but not limited to, doped Si, doped Ge, doped SiGe, and doped SiC. In certain such embodiments, the source/drain regions 530 may have a z-height elevated, or raised, beyond that of the fin 510, as is illustrated in FIG. 6C. As further illustrated in FIG. 5C, the maximum transverse width of the fin 510 within the source/drain regions 530 may also increase relative to the channel portion of the fin 510. In some embodiments, portions of the fin 510 exposed by removal of the surrounding material 544 are removed (etched) and semiconductor then regrown, for example with an epitaxial deposition process, to form an embedded epitaxial source/drain, which may also be raised, but need not be necessarily. Upon forming the source/drain regions 530, the placeholder stripes 518A-518D may be re-planarized, for example with deposition of another surrounding material 545, such as a flowable dielectric, and a polish, if desired.

Figure 5D:
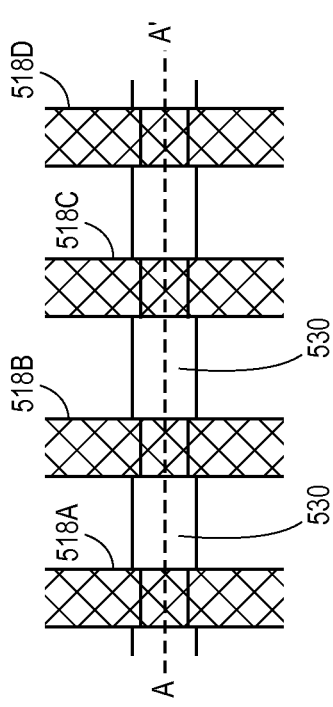
Figure 6D:
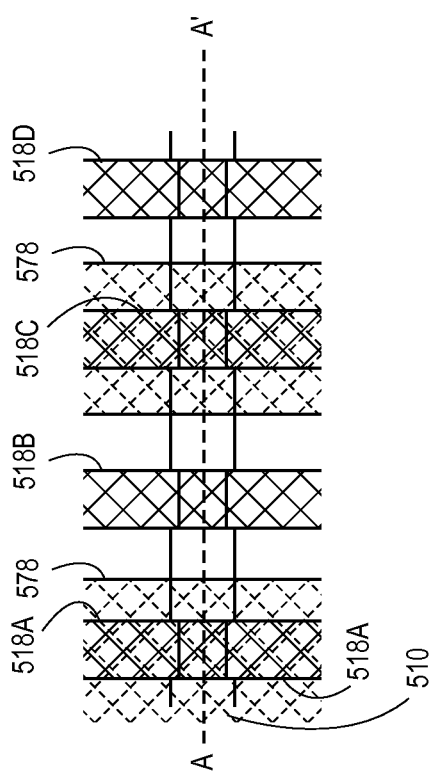
Figure 6E:
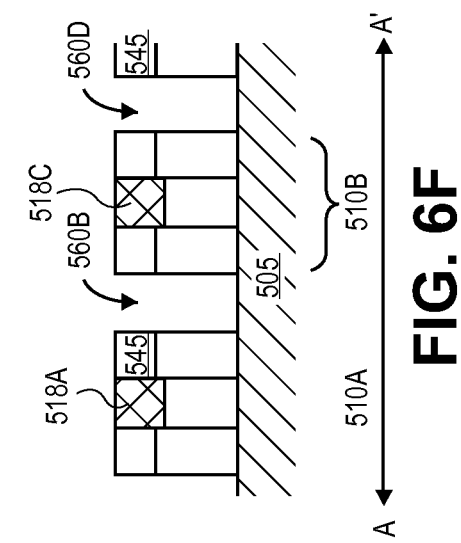
Figure 6F:
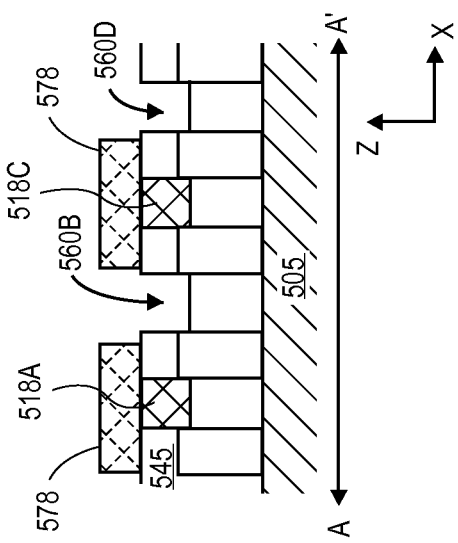
Figure 5E:
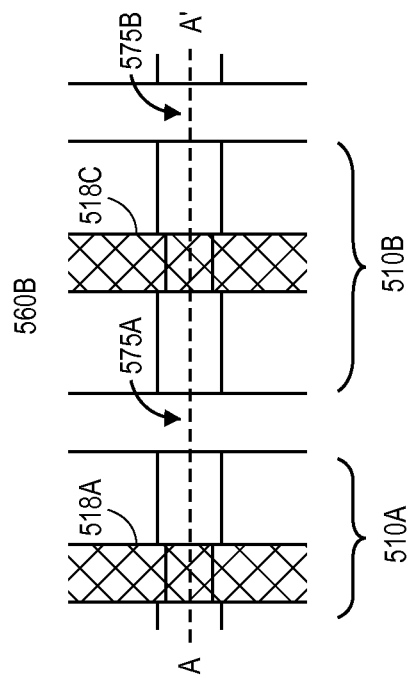
Figure 5F:
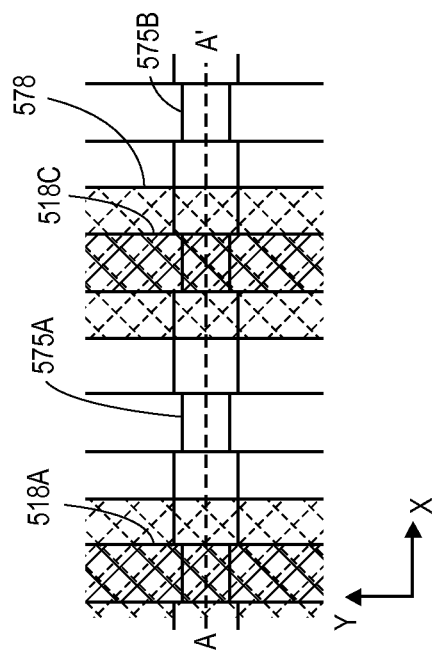

Returning to FIG. 4, with the placeholders and source/drains formed, the method 401 proceeds with removing a subset of the placeholders at operation 420 (selective to the surrounding material 545). The selective removal of a subset of the placeholders may be performed with a patterned etch, for example as illustrated in FIGS. 5D and 6D. The masking features 578 may be any conventional masking material, such as, but not limited to, a photoresist, or a non-photosensitive hardmask, such as amorphous (CVD) carbon, or spin-on organics. For patterning of the masking features 578, overlay need only be sufficient to ensure first placeholders 518A and 518C are protected while second placeholders 518B and 518D are exposed. As further shown in FIGS. 5E and 6E, operation 420 is completed with removal of the exposed placeholders 518B, 518D, to form openings 560B and 560D exposing portions 575A and 575B of the semiconductor fin 510. Removal of the exposed placeholders 518B, 518D may be with any etch process (e.g., plasma and/or wet chemical) that has adequate selectivity to the placeholder material (e.g., polysilicon) over the surrounding material 545 (e.g., silica, CDO, etc.) so that the openings 560B and 560D are self-aligned to the placeholders 518B, 518D.

Returning to FIG. 4, at operation 430 semiconductor fin portions exposed by removal of some of the placeholder features are then removed to bifurcate the semiconductor fin at isolation points. As further shown for the exemplary embodiment in FIGS. 5F and 6F, the first semiconductor fin portions 575A and 575B are etched away, for example down to the substrate 505, which bifurcates or "cuts" the semiconductor fin 510 into separate semiconductor fins 510A and 510B. One or more plasma and/or wet chemical etches may be performed, as dependent on the composition of the semiconductor fin, with the openings 560B and 560D controlling the dimensioning of the cut through the semiconductor fin. An etch process similar to that employed to initially form the semiconductor fin 510 (at operation 405) may be utilized, for example. With sufficient etch selectivity between the semiconductor fin material (e.g., silicon) and the surrounding material 545 (e.g., silica), the openings 560B and 560D are self-aligned to the placeholders that were removed (e.g., 518B, 518D) and therefore also self-aligned to the remaining placeholders (e.g., 518A and 518C). It should be noted that while the openings 560B and 560D are self-aligned, in particular embodiments, the width (x-dimension) of such openings may vary somewhat as a function of etch bias in the fin etch. An advantageous etch bias may shrink the opening widths to further increase transistor density, or an etch bias may increase the opening width to further increase transistor isolation, or an etch bias may exactly maintain the opening. In any case, centerlines of the openings 560B and 560D remain self-aligned to centerlines of the remaining placeholders 518A and 518C.

Returning to FIG. 4, at operation 440 a dielectric material is filled into the openings where the fin portions were removed to complete formation of the isolation regions 550, as is further illustrated in FIGS. 5G and 6G. Generally, any dielectric fill may be utilized, such as, but not limited to high density plasma (HDP) and flowable dielectric processes. In further embodiments, a dielectric material which induces a stress on the fins 510A and 510B (compressive or tensile stress, or both were an iterative fin cut process is performed with n-type and p-type fins separated in successive steps) may be deposited into the openings 560B, 560D.

With fin isolation regions formed, one or more remaining placeholders are then removed at operation 450 (FIG. 4). As is also shown in FIGS. 5G and 6G, the placeholders 518A and 518C have been removed, again selectively to the surrounding material 545 and selectively to isolation region 550. Openings 560A and 560C (FIG. 5G) exposing second semiconductor fin regions 585A and 585B are therefore again self-aligned to the sacrificial placeholder features, and as such, self-aligned to the isolation regions 550.

The method 401 then completes with forming gate stacks at operation 460 using any formation technique known in the art, such as, but not limited to chemical vapor deposition (CVD), atomic layer deposition (ALD), and physical vapor deposition (PVD). As shown in FIGS. 5H and 6H, the gate dielectric 565 and gate electrodes 520A and 520B having any suitable work function may be deposited into the openings 560A and 560C, as dimensioned by the placeholder formation operation 410 to be self-aligned to the placeholder features and, as such, self-aligned to the isolation regions 550.

Of further note for embodiments where semiconductor fins have a lattice mismatch with a substrate over which the fins are disposed inducing a first level of stress in the fins (e.g., at operation 405), the through gate isolation technique demonstrated by the method 401 has been found to have the further advantage of maintaining a significant portion of the fin stress. Although not bound by theory, this advantage is currently thought to stem from bifurcating the fins after the placeholder features are formed, and more particularly after both the placeholder features and source/drain regions are formed. The presence of the placeholder features and dielectric covering source-drain regions serve as reinforcement, mechanically holding the semiconductor fin while the isolation cuts are made and thereby locking-in a large portion of the channel strain. Once the isolation openings are filled with dielectric, the isolation regions 150 then perform a similar strain-retention function while the remaining placeholder features are removed and replaced with non-sacrificial gate stacks.

As one specific example, wherein a SiGe alloy (e.g., ~30% Ge) semiconductor fin is formed on a silicon substrate, the stress remaining after cutting the fin (e.g., at operation 430) is at least 50% of the stress present at initial fin formation (e.g., at operation 430) for both tri-gate and nanowire embodiments. As a point of comparison, removing a same portion of the fin prior to forming the placeholder structures was found to retain only about 15-20% of the initial channel stress.

Figure 7:
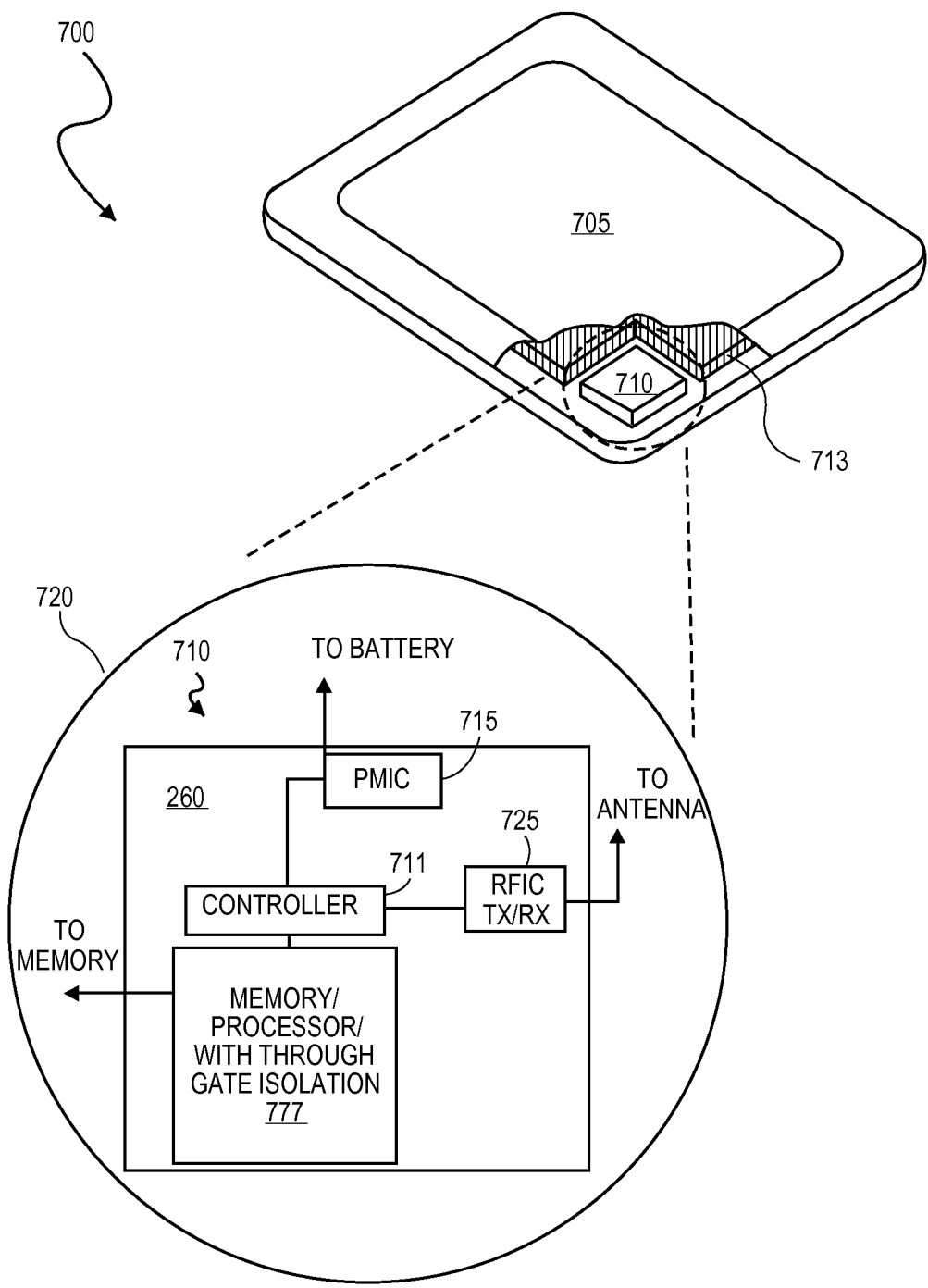
FIG. 7 is an isometric view of a mobile computing platform employing an IC having non-planar transistor and through gate fin isolation structures, in accordance with an embodiment of the present invention.

FIG. 7 is a functional block diagram of a mobile computing platform 700 which employs an IC including circuitry using non-planar transistors with through gate isolation in accordance with embodiments of the present invention (e.g., inverter 100 illustrated in FIG. 1A is present in the platform 700). The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touchscreen (capacitive, inductive, resistive, etc.), a chip-level (SoC) or package-level integrated system 710, and a battery 713. As illustrated, the greater the level of integration in the system 710 enabled by higher transistor packing density, the greater the portion of the mobile computing platform 700 that may be occupied by the battery 713 or non-volatile storage, such as a solid state drive, or the greater the transistor gate count for improved platform functionality. Similarly, the greater the carrier mobility of each transistor in the system 710, the greater the functionality. As such, the through gate isolation architecture and techniques described herein enable performance and form factor improvements in the mobile computing platform 700.

The integrated system 710 is further illustrated in the expanded view 720. In the exemplary embodiment, packaged device 777 includes at least one memory chip (e.g., RAM), or at least one processor chip (e.g., a multi-core microprocessor and/or graphics processor) including through gate isolation. The packaged device 777 is further coupled to the board 260 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprises a power amplifier on a transmit path and a low noise amplifier on a receive path), and a controller thereof 711. Functionally, the PMIC 715 performs battery power regulation, DC-to-DC conversion, etc., and so has an input coupled to the battery 713 and with an output providing a current supply to all the other functional modules. As further illustrated, in the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 777 or within a single IC (SoC) coupled to the package substrate of the packaged device 777.

Figure 8:
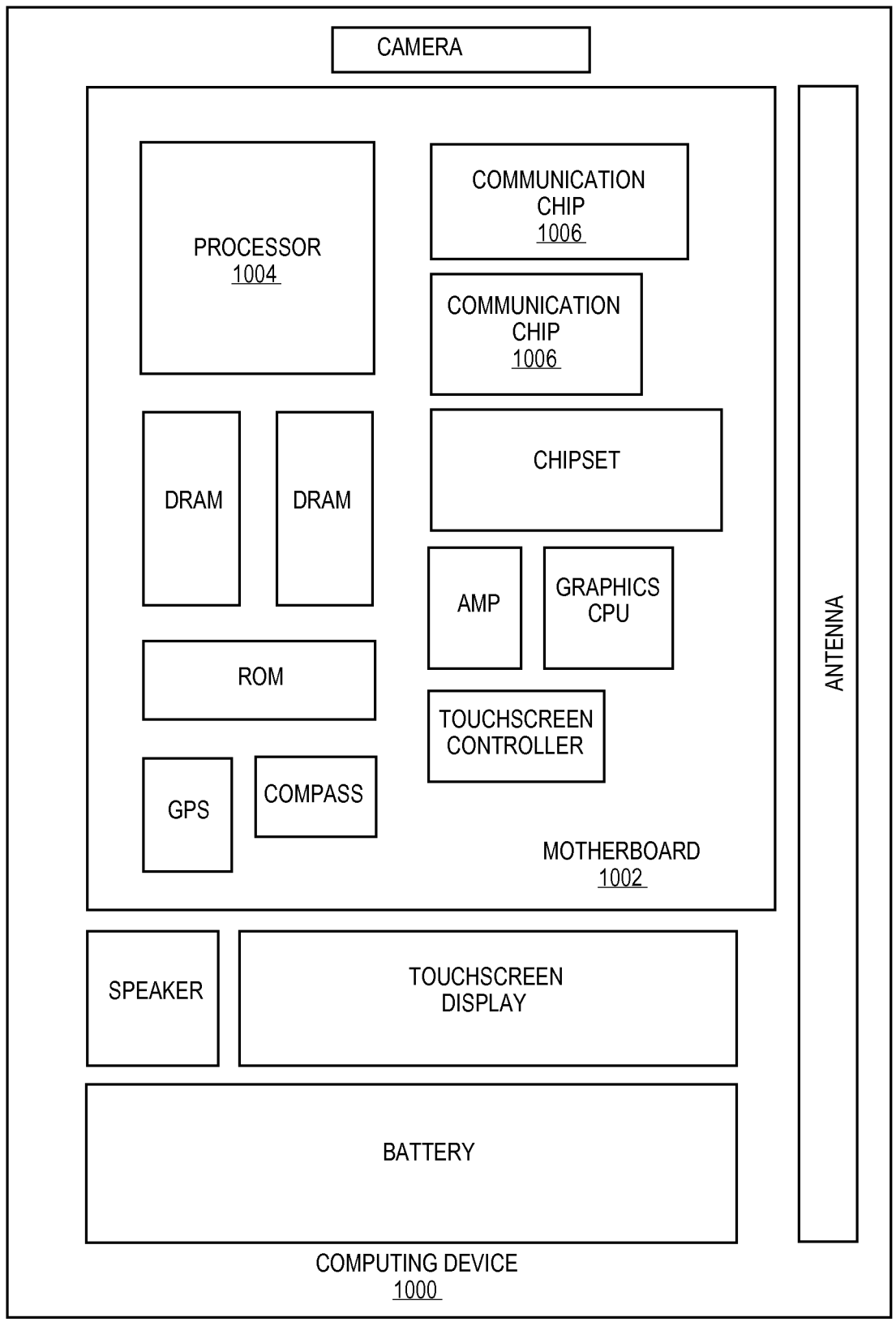
FIG. 8 is a functional block diagram of the mobile device illustrated in FIG. 7, in accordance with an embodiment of the present invention.

FIG. 8 is a functional block diagram of a computing device 1000 in accordance with one embodiment of the invention. The computing device 1000 may be found inside the platform 700, for example, and further includes a board 1002 hosting a number of components, such as but not limited to a processor 1004 (e.g., an applications processor) and at least one communication chip 1006. In embodiments, at least one of the processor 1004 and communication chip 1006 incorporate non-planar transistors with through gate isolation, as described elsewhere herein. The processor 1004 is physically and electrically coupled to the board 1002. The processor 1004 includes an integrated circuit die packaged within the processor 1004. The term "processor" may refer to any device or portion of a device that processes electronic data from registers and/or memory to transform that electronic data into other electronic data that may be stored in registers and/or memory.

In some implementations the at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

Many exemplary embodiments are described herein. One embodiment is a microelectronic device, including a first gate electrode disposed over a first semiconductor fin, a second gate electrode disposed over a second semiconductor fin, a first isolation region disposed between the first and second gate electrodes and separating adjacent ends of the first and second semiconductor fins with the first electrode, second gate electrode, and first isolation region being substantially parallel with longitudinal centerlines at a substantially equal pitch.

In a further embodiment, the microelectronic device further includes a second isolation region disposed on an end of the first semiconductor fin opposite the first isolation region with centerlines of the first and second isolation regions defining an isolation region pitch that is an integer multiple of a minimum pitch for the gate electrodes. In a further embodiment, centerlines the first and second gate electrodes define a gate electrode pitch that is an integer multiple of the minimum gate electrode pitch. In a further embodiment, the gate electrode pitch is substantially equal to the isolation region pitch with the gate electrodes and isolation regions forming stripes at a minimum stripe pitch.

In another embodiment, the microelectronic device further includes a third gate electrode disposed over the first semiconductor fin between the first and second isolation regions with centerlines of the first and third gate electrodes at the minimum stripe pitch and the isolation region pitch being substantially equal to at least two times the minimum stripe pitch. In a further embodiment, the isolation region abuts the ends of the first and second semiconductor fins and has a transverse width that is no larger than a width of a gate stack that includes both the gate electrode and a gate dielectric layer in contact with the gate electrode.

In another embodiment, the microelectronic device further comprises a third and fourth semiconductor fins with the first gate electrode disposed over both the first and third semiconductor fins and the second gate electrode disposed over both the second and fourth semiconductor fins, and with the first isolation region separating adjacent ends of the first and second semiconductor fins as well as ends of the third and fourth semiconductor fins. The first semiconductor fin includes source and drain regions of a conductivity type complementary to source and drain regions in the third semiconductor fin, and the second semiconductor fin includes source and drain regions of a conductivity type complementary to source and drain regions of the fourth semiconductor.

One embodiment is a microelectronic device including a plurality of gate electrode stripes disposed over a plurality of semiconductor fins, and a plurality of isolation stripes substantially parallel to the plurality of gate electrode stripes and disposed between adjacent ones of the plurality of semiconductor fins. The plurality of isolation stripes are self-aligned to the plurality of gate electrode stripes. In embodiments, the plurality of gate electrode stripes and plurality of isolation stripes have a pitch that is an integer multiple of a minimum stripe pitch.

In embodiments the plurality of gate electrode stripes are interdigitated with the plurality of isolation stripes to have one or more gate electrode stripe between adjacent isolation stripes and/or to have one or more isolation stripes between adjacent gate electrode stripes to form a population of stripes of a fixed pitch.

In one embodiment, a method of fabricating a microelectronic device includes receiving a semiconductor fin disposed over a substrate, forming a gate electrode over the semiconductor fin, and bifurcating the semiconductor fin at an isolation point that is self-aligned to the gate electrode. In another embodiment, bifurcating the semiconductor fin at the isolation point further includes defining dimensions of the gate electrode and dimensions of the isolation point with a single lithographic patterning mask. In another embodiment, bifurcating the semiconductor fin at the isolation point further includes removing a first portion of the semiconductor fin at the isolation point selectively to a second portion of the semiconductor fin over which the gate electrode is disposed. In another embodiment, defining dimensions of the gate electrode and dimensions of the isolation point with a single lithographic patterning mask further includes defining a plurality of gate electrode placeholders over the semiconductor fin. The fabrication embodiments may further include removing a subset of the gate electrode placeholders to expose the first portion of the fin.

In another embodiment, a microelectronic device is fabricated by forming a plurality of sacrificial placeholders over a semiconductor fin, removing a subset of the sacrificial placeholders, removing a portion of the fin exposed by the placeholder removal, depositing a dielectric material where fin portion was removed, and replacing a second subset of the sacrificial placeholders a non-sacrificial gate stack. In further embodiments, forming the plurality of sacrificial placeholders further comprises forming three placeholders over two semiconductor fins, removing the first subset of the sacrificial placeholders comprises removing a center one of the three sacrificial placeholders, removing a portion of the semiconductor fin exposed by the placeholder removal further comprises bifurcating the semiconductor fin into first and second semiconductor fins, and replacing the second subset of sacrificial placeholders comprises removing a remaining two of the three sacrificial placeholders to form openings exposing second portions of the first and second semiconductor fins, and forming a first and second gate stack over the second portions of the first and second semiconductor fins. In further embodiments, removing a center one of the three sacrificial placeholders comprises masking off an outer pair of the three sacrificial placeholders. In further embodiments, forming the plurality of sacrificial placeholders over the semiconductor fin further comprises printing a grating pattern of a fixed pitch. In embodiments where the plurality of semiconductor fins have a lattice mismatch with a substrate over which the fins are disposed, the lattice mismatch induces a first level of stress in the fins and the sacrificial placeholder maintains at least 50% of the first level of stress in the fins after removing the portion of the fin. In certain such embodiments, the plurality of semiconductor fins comprises a SiGe alloy while the substrate is a silicon substrate.

It will be recognized that the invention is not limited to the embodiments so described, but can be practiced with modification and alteration without departing from the scope of the appended claims. The scope of the invention should, therefore, be determined with reference to the appended claims, along with the full scope of equivalents to which such claims are entitled.

What is claimed is:

1. A microelectronic device, comprising:
a first gate electrode disposed over a first semiconductor fin wherein the first semiconductor fin has a length greater than a width, wherein the length is the distance between ends of the fin;
a second gate electrode disposed over a second semiconductor fin wherein the second semiconductor fin has a length greater than a width, wherein the length is the distance between ends of the fin, wherein the first and second semiconductor fins consist essentially of silicon,
a first isolation region disposed between the first and second gate electrodes and separating adjacent ends of the first and second semiconductor fins, and wherein the first isolation region directly contacts the adjacent ends of the first and second semiconductor fins, wherein the first semiconductor fin and the second semiconductor fin are bifurcated portions of a single semiconductor feature,
a first embedded epitaxial semiconductor region in a portion of the first semiconductor fin between the first gate electrode and the first isolation region,
a second embedded epitaxial semiconductor region in a portion of the second semiconductor fin between the second gate electrode and the second isolation region, the first and second embedded epitaxial semiconductor regions consisting essentially of silicon germanium, and
wherein the first gate electrode, second gate electrode, and first isolation region are substantially parallel with longitudinal centerlines at a substantially equal pitch,
wherein the first semiconductor fin and the second semiconductor fin have longitudinal centerlines that are substantially coincident, and wherein a surface of the first gate electrode facing away from the first fin is substantially coplanar with a surface of the first isolation region, and wherein the first isolation region has a transverse width that is no larger than a width of a gate stack that includes both the first gate electrode and a gate dielectric layer in contact with the first gate electrode, wherein the width of the gate stack is parallel along a same direction as the transverse width of the first isolation region.

2. The microelectronic device of claim 1, further comprising a second isolation region disposed on an end of the first semiconductor fin opposite the first isolation region, wherein centerlines of the first and second isolation regions define an isolation region pitch that is an integer multiple of a minimum pitch for the gate electrodes.

3. The microelectronic device of claim 2, wherein centerlines of the first and second gate electrodes define a gate electrode pitch that is an integer multiple of the minimum gate electrode pitch.

4. The microelectronic device of claim 3, wherein the gate electrode pitch is substantially equal to the isolation region pitch with the gate electrodes and isolation regions forming stripes at a minimum stripe pitch.

5. The microelectronic device of claim 1, further comprising a third and fourth semiconductor fins, wherein the first gate electrode is disposed over both the first and third semiconductor fins and the second gate electrode is disposed over both the second and fourth semiconductor fins, and wherein the first isolation region separates adjacent ends of the first and second semiconductor fins and the third and fourth semiconductor fins.

6. The microelectronic device of claim 5, wherein the first semiconductor fin includes source and drain regions of a conductivity type complementary to source and drain regions in the third semiconductor fin, and wherein the second semiconductor fin includes source and drain regions of a conductivity type complementary to source and drain regions of the fourth semiconductor.

7. A microelectronic device, comprising:
a plurality of gate electrode stripes disposed over a plurality of semiconductor fins each having a length greater than a width, wherein the length is the distance between ends of the fins, wherein each of the plurality of semiconductor fins consists essentially of silicon;
a plurality of isolation stripes substantially parallel to the plurality of gate electrode stripes and disposed between adjacent ones of the plurality of semiconductor fins, wherein the plurality of isolation stripes are self-aligned to the plurality of gate electrode stripes and between adjacent ends of the semiconductor fins, wherein the plurality of isolation stripes directly contact the adjacent ends of the semiconductor fins, wherein the adjacent ones of the plurality of semiconductor fins are bifurcated portions of a single semiconductor feature, wherein the adjacent semiconductor fins have longitudinal centerlines that are substantially coincident, and wherein surfaces of the gate electrode stripes facing away from surfaces of the semiconductor fins are substantially coplanar with surfaces of the isolation stripes, wherein the plurality of isolation stripes each have a transverse width that is no larger than a width of a gate stack that includes a gate electrode stripe of one of the plurality gate electrode stripes and a gate dielectric layer in contact with the gate electrode stripe, wherein the width of the gate electrode stripe is parallel along a same direction as the transverse width of each isolation stripe; and
a plurality of embedded epitaxial semiconductor regions in corresponding portions of the plurality of semiconductor fins between the plurality of gate electrode stripes and the plurality of isolation stripes, the plurality of embedded epitaxial semiconductor regions consisting essentially of silicon germanium.

8. The microelectronic device of claim 7, wherein the plurality of gate electrode stripes and plurality of isolation stripes have a pitch that is an integer multiple of a minimum stripe pitch.

9. The microelectronic device of claim 7, wherein the plurality of gate electrode stripes is interdigitated with the plurality of isolation stripes to form a population of stripes of a fixed pitch.

* * * * *